(12) United States Patent  
Matsubara (10) Patent No.: US 8,519,389 B2
(45) Date of Patent: Aug. 27, 2013

(54) SEMICONDUCTOR DEVICE, METHOD OF MANUFACTURING THE SAME, AND METHOD OF DESIGNING THE SAME

(75) Inventor: Yoshihisa Matsubara, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 112 days.

(21) Appl. No.: 13/159,616

(22) Filed: Jun. 14, 2011

(65) Prior Publication Data

US 2012/0012843 A1    Jan. 19, 2012

(30) Foreign Application Priority Data

Jul. 15, 2010    (JP) .................................. 2010-160602

(51) Int. Cl.
*H01L 23/58*    (2006.01)
(52) U.S. Cl.
USPC .................................. 257/48; 257/E23.179

(58) Field of Classification Search
USPC .................. 257/48, E23.179; 438/17, 18
See application file for complete search history.

(56) References Cited

U.S. PATENT DOCUMENTS 7,598,523 B2 * 10/2009 Luo et al. ........................ 257/48
2008/0252306 A1    10/2008 Matsubara

FOREIGN PATENT DOCUMENTS

| JP | 62-86741 A | 4/1987 |
| JP | 2000-164497 A | 6/2000 |
| JP | 2008-270277 A | 11/2008 |

* cited by examiner

*Primary Examiner* — Quoc Hoang
(74) *Attorney, Agent, or Firm* — Foley & Lardner LLP (57) ABSTRACT

Unless layers over a TEG pattern are removed, a test using the TEG pattern is conducted. Multiple wiring layers are formed over a first TEG pattern. A wiring and multiple dummy patterns are formed in each of the wiring layers. An electrode pad is formed in an uppermost wiring layer. In a planar view, the first TEG pattern eliminates overlap with all of the wirings and the dummy patterns.

9 Claims, 7 Drawing Sheets

SEMICONDUCTOR DEVICE, METHOD OF MANUFACTURING THE SAME, AND METHOD OF DESIGNING THE SAME

CROSS-REFERENCE TO RELATED APPLICATIONS

The disclosure of Japanese patent Application No. 2010-160602 filed on Jul. 15, 2010 including the specification, drawings and abstract is incorporated herein by reference in its entirely.

BACKGROUND

The present invention relates to a semiconductor device having a test element group (TEG) pattern, a method of manufacturing the semiconductor device, and a method of designing the semiconductor device.

The semiconductor device is provided with a TEG pattern for evaluating the displacement of a pattern. For example, Japanese Unexamined Patent Application Publication NO. Sho 62(1987)-86741 discloses that an electrically conductive state between a first thin film electrode array arranged at first pitches and a second thin film electrode array arranged at second pitches is confirmed to evaluate a positional displacement therebetween.

Also, Japanese Unexamined Patent Application Publication NO. 2008-270277 discloses a positional displacement detection pattern that can detect a relative positional displacement between wirings and via plugs.

Japanese Unexamined Patent Application Publication NO. 2000-164497 discloses that an alignment mark is formed by a part of a trench separation film, and a gate electrode film over the alignment mark is removed.

SUMMARY

A specific TEG pattern, for example, a TEG pattern used for an OBIRCH (optical beam induced resistance change) needs to be visible in conducting a test using the TEG pattern. On the other hand, the TEG pattern is normally arranged in a scribe line. In order to prevent an in-plane distribution from occurring in a film thickness, multiple dummy patterns is also arranged in the scribe line. In most of cases, the dummy patterns are automatically arrayed by a design support device for the semiconductor device when the semiconductor device is designed.

After a study by the present inventors, because wiring layers are increasingly multi-layered in the semiconductor device in recent years, if the dummy patterns are arrayed in a normal procedure, the TEG pattern is covered with the dummy pattern formed over each of the wiring layers. It is found that the TEG pattern may not be visible from the external as it is. In this case, no test using the TEG pattern is conducted unless the layers over the TEG pattern are removed.

According to one aspect of the present invention, a semiconductor device includes: a first TEG (test element group) pattern; multiple wiring layers formed over the first TEG pattern; a wiring and multiple dummy patterns formed over each of the wiring layers; and an electrode pad formed in an uppermost wiring layer, and the first TEG pattern eliminates overlap with all of the wirings and the dummy patterns in a planar view.

According to the aspect of the present invention, in the planar view, the first TEG pattern eliminates overlap with all of the wirings and the dummy patterns formed over the upper layers. For that reason, unless the layers over the TEG pattern are removed, the TEG pattern is visible from the external. Accordingly, unless the layers over the TEG pattern are removed, a test using the TEG pattern can be conducted.

According to another aspect of the present invention, a method of manufacturing a semiconductor device includes the steps of:
forming a first TEG pattern; and
forming multiple wiring layers over the first TEG pattern, and
multiple dummy patterns are formed in the step of forming the plurality of wiring layers, and
the first TEG pattern eliminates overlap with all of the wirings and the dummy patterns.

According to still another aspect of the present invention, a method of designing a semiconductor device includes the steps of:
arraying a TEG pattern; and
setting an area overlapping with the TEG pattern in each of multiple wiring layers disposed over the first TEG pattern in a planar view to a pattern array prohibition area.

According to the present invention, unless the layers over the TEG pattern are removed, a test using the TEG pattern can be conducted.

DETAILED DESCRIPTION

Hereinafter, embodiments of the present invention will be described with reference to the accompanying drawings. In all of the drawings, the same components are denoted by identical symbols, and their description will be appropriately omitted.

Figure 1:
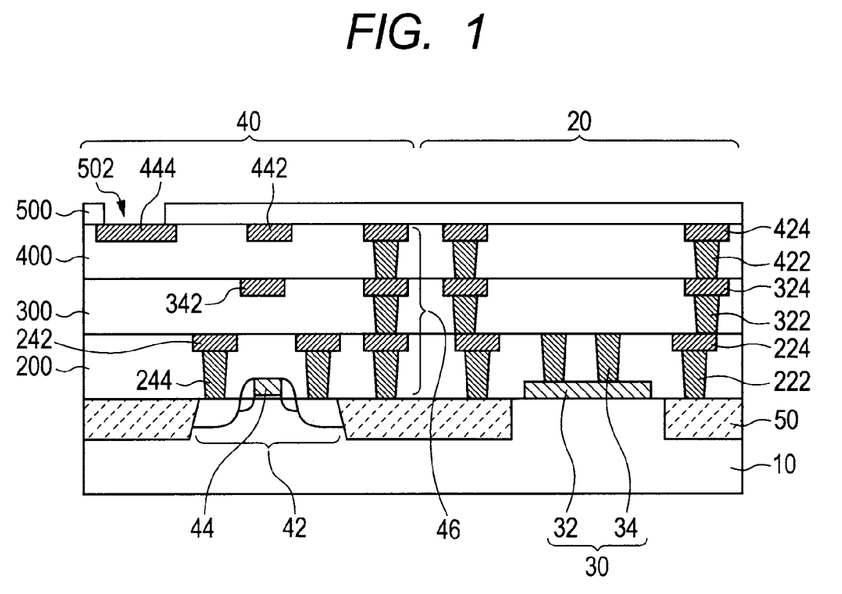
FIG. 1 is a cross-sectional view illustrating a configuration of a semiconductor device according to a first embodiment.

FIG. 1 is a cross-sectional view illustrating a configuration of a semiconductor device according to a first embodiment. The semiconductor device includes a first TEG pattern 30, multiple wiring layers 200, 300, 400, multiple dummy patterns 224, 324, 424, and an electrode pad 444. The wiring layers 200, 300, and 400 are formed over the first TEG pattern 30. On the wiring layers 200, 300, and 400 are formed wirings 242, 342, 442, and the dummy patterns 224, 324, and 424, respectively. An electrode pad 444 is formed in the uppermost wiring layer 400. In a planar view, the first TEG pattern 30 eliminates overlap with all of the wirings 242, 342, 442 and the dummy patterns 224, 324, 424.

The details will be described below.

The semiconductor device has a scribe area 20 and an internal area 40.

The internal area 40 has circuits formed therein, and a periphery of the internal area 40 is surrounded by a sealing 46. The sealing 46 is formed by, for example, stacking metal films in the same layers as those of the respective wirings, and metal films in the same layers as those of respective via holes or contacts. In an example illustrated in FIG. 1, the sealing 46 is single, but may be multiply formed. Various elements for forming a circuit, for example, a transistor 42 is formed inside the sealing 46. The transistor 42 is formed over a substrate 10, and has a gate electrode 44.

Also, the wirings 242, 342, 442, a contact 244, and the electrode pad 444 are formed inside the sealing 46. The wiring 242 and the contact 244 are formed in the first wiring layer 200. The contact 244 illustrated in FIG. 1 is coupled to the transistor 42. However, the contacts 244 not shown are formed in the wiring layer 200. The wiring 342 is formed in the second wiring layer 300, and the wiring 442 and the electrode pad 444 are formed in the uppermost wiring layer 400. Also, multiple via holes are formed in the wiring layers 300 and 400 although not shown. The wirings 242, 342, 442, the contact 244, and the via holes not shown are formed through, for example, a damascene method. However, any layer may be formed through a method other than the damascene method.

The scribe area 20 is diced when the semiconductor device is cut out from a wafer, but a part of the scribe area 20 remains in an edge of the semiconductor device. In the scribe area 20 are formed the first TEG pattern 30 and the dummy patterns 224, 324, 424.

A first pattern 32 of the first TEG pattern 30 is formed in the same layer as that of the gate electrode 44 of the transistor 42 in the same process as that of the gate electrode 44. A contact 34 is embedded in the wiring layer 200, and formed in the same process as that of the contact 244. No element isolation film 50 is formed in the area where the first TEG pattern 30 is formed.

The dummy patterns 224 are formed in the first wiring layer 200, and the dummy patterns 324 are formed in the second wiring layer 300. The dummy patterns 424 are formed in the third wiring layer 400. When the wirings 242, 342, and 442 are formed, the dummy patterns 224, 324, and 424 are formed in order to prevent variations of those wirings in an in-plane direction from occurring.

Also, at least one of the dummy contacts 222 and at least one of the dummy via holes 322 and 422 are formed in the scribe area 20. The dummy contacts 222 are embedded in the wiring layer 200, and each upper portion of the dummy contacts 222 is coupled to any one of the dummy patterns 224. The dummy via holes 322 are embedded in the wiring layer 300, and each upper portion of the dummy via holes 322 is coupled to any one of the dummy patterns 324. The dummy via holes 422 are embedded in the wiring layer 400, and each upper portion of the dummy via holes 422 is coupled to any one of the dummy patterns 424.

Also, a passivation film 500 is formed over the uppermost wiring layer 400. The passivation film 500 is configured to protect the multi-layered wiring layers of the semiconductor device. In the passivation film 500 is formed an opening 502 located over the electrode pad 444.

Figure 2:
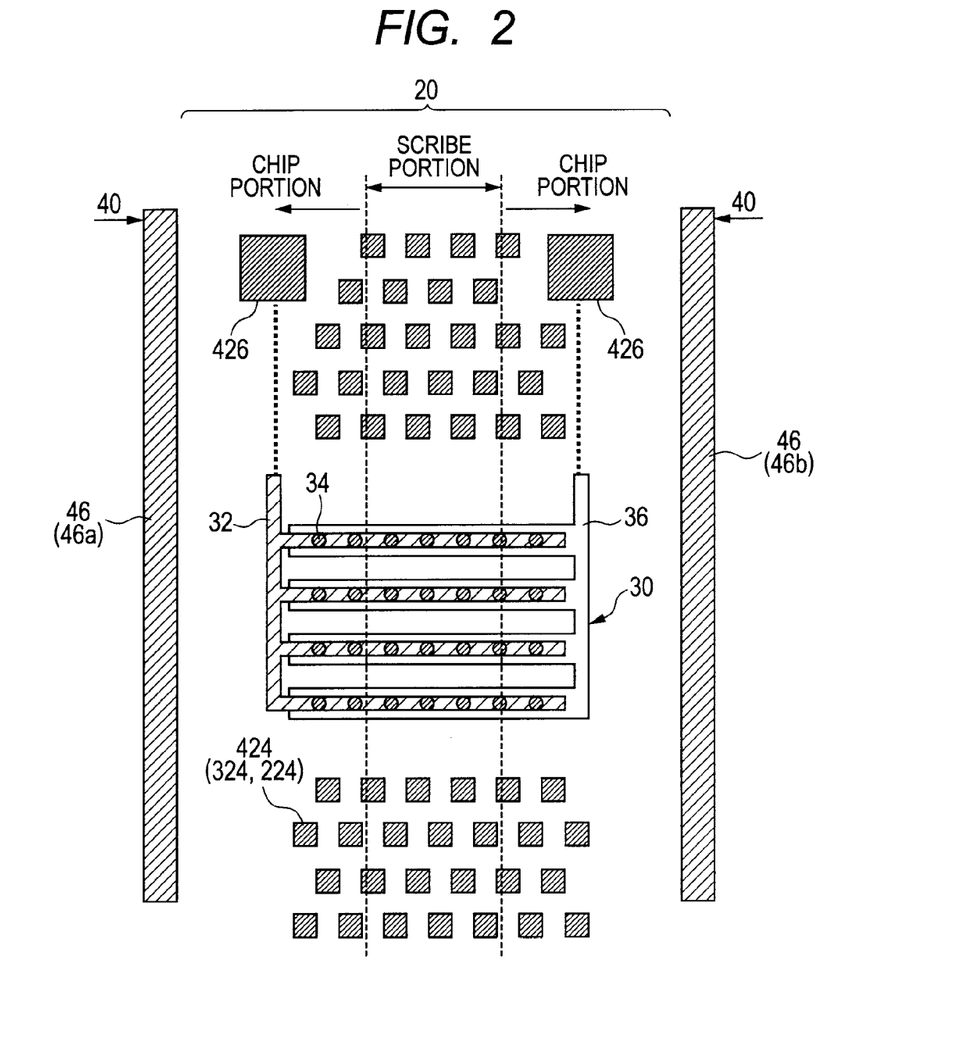
FIG. 2 is a top view illustrating a scribe area and a periphery thereof in the semiconductor device illustrated in FIG. 1.

FIG. 2 is a top view illustrating a scribe area and a periphery thereof in the semiconductor device illustrated in FIG. 1. In an example illustrated in FIG. 2, the dummy pattern 424 and the first TEG pattern 30 are located between a seal ring 46 (46a) of a first semiconductor chip and a seal ring 46 (46b) of a second semiconductor chip adjacent to the first semiconductor chip. As described above, in the planar view, the first TEG pattern 30 eliminates overlap with all of the dummy patterns 224, 324, and 424. More specifically, the dummy patterns 224, 324, and 424 are disposed at positions sandwiching the first TEG pattern 30 in the planar view. The layout of the dummy patterns 224, 324, and 424 is not limited to the example illustrated in FIG. 2.

The first TEG pattern 30 is, for example, a TEG pattern for OBIRCH, or a TEG pattern for visually confirming the positional displacement in the planar view. If the first TEG pattern 30 is the TEG pattern for OBIRCH, the first TEG pattern 30 has, for example, the first pattern 32, a second pattern 36, and the contact 34, as illustrated in FIG. 2. As described above, the first pattern 32 is formed in the same layer as that of the gate electrode 44 of the transistor 42. The second pattern 36 is a diffusion layer formed in the substrate 10, and formed around the gate electrode 44 in the planar view. The contact 34 is coupled to the first pattern 32 in a state where no displacement occurs. Two test electrodes 426 are formed in an area between the two seal rings 46a and 46b. The test electrodes 426 are formed in the uppermost wiring layer 400. One of the test electrodes 426 is coupled to the first pattern 32 through a pattern (not shown) and a via hole (not shown) formed in the wiring layers 300 and 200. The other test electrode 426 is coupled to the second pattern 36 through a pattern (not shown) and a via hole (not shown) formed in the wiring layers 300 and 200. A necessary voltage is applied between those two test electrodes 426, and the first TEG pattern 30 is irradiated with a laser beam from above of the passivation film 500.

Figure 3:
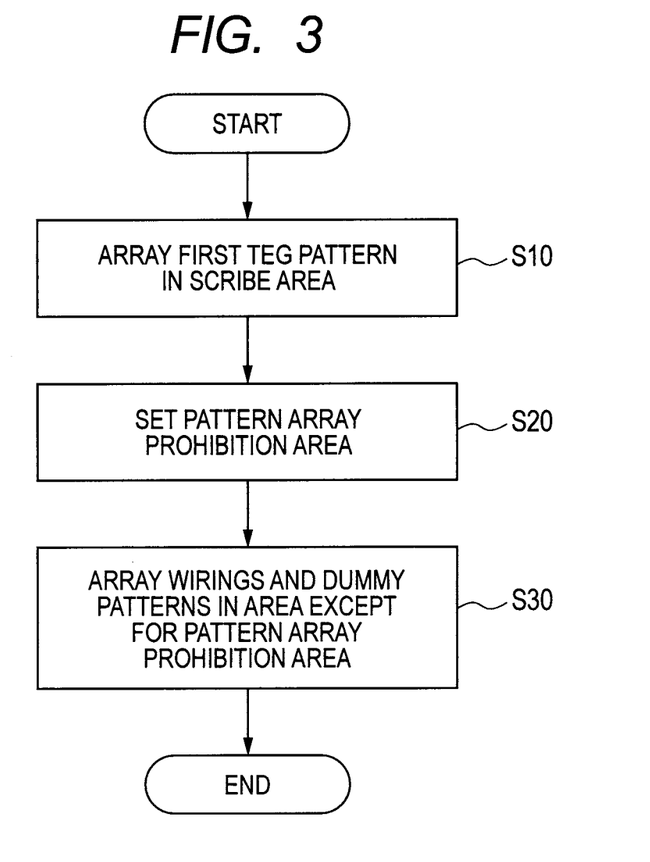
FIG. 3 is a flowchart showing a method of designing the semiconductor device illustrated in FIGS. 1 and 2.

When the first semiconductor chip and the second semiconductor chip are separated from each other, a part (a scribed portion in the figure) of the area between those two seal rings 46a and 46b is removed by a dicing blade. However, because the interval between those two seal rings 46a and 46b is larger than a width of the dicing blade, parts of the first TEG pattern 30 and the dummy patterns 424, 324, 224 remain outside the seal ring 46 in each of the first semiconductor chip and the second semiconductor chip after separation FIG. 3 is a flowchart showing a method of designing the semiconductor device illustrated in FIGS. 1 and 2. Processing illustrated in FIG. 3 is conducted with the use of a design support device for the semiconductor device.

First, a designer or the design support device for the semiconductor device arranges the first TEG pattern 30 in any area of the scribe area (Step S10). Then, the design support device sets a pattern array prohibition area in each layer over the layer where the first TEG pattern 30 is formed (step S20). The pattern array prohibition area overlaps with the first TEG pattern 30 in the planar view, and prohibits array of the dummy patterns and the wirings. The design support device arrays the wirings and the dummy patterns in areas other than the pattern array prohibition area (Step S30).

The semiconductor device designed as described above is manufactured as follows. The element isolation film 50 and the transistor 42 are first formed in the substrate 10. When the gate electrode 44 of the transistor 42 is formed, the first pattern 32 and the second pattern 36 of the first TEG pattern 30 are also formed. Then, the wiring layers 200, 300, 400, the wirings 242, 342, 442, the electrode pad 444, the contact 244, and various via holes are formed over the transistor 42, the first pattern 32, and the element isolation film 50. In this situation, the contact 34 of the first TEG pattern 30, the dummy patterns 224, 324, 424, and the test electrode 426 are formed. Then, the passivation film 500 is formed over the uppermost wiring layer 400, and the opening 502 is formed in the passivation film 500.

If a test using the first TEG pattern 30 is required, a necessary voltage is applied between the two test electrodes 426, and the first TEG pattern 30 is irradiated with a laser beam from above of the passivation film 500.

Subsequently the operation and the advantages of this embodiment will be described. In this embodiment, in the planar view, the first TEG pattern 30 eliminates overlap with all of the wirings and the dummy patterns. Accordingly, if a test using the first TEG pattern 30 is required, there is no need to remove the layers over the first TEG pattern 30, such as the passivation film 500 and the wiring layers 300, 400.

Also, in this embodiment, the test electrodes 426 are provided. The test electrodes 426 are formed in the wiring layer 400 of the uppermost layer, and coupled to two patterns configuring the first TEG pattern 30. Accordingly, with the use of the test electrodes 426, a necessary voltage can be easily applied to the first TEG pattern 30.

Figure 4:
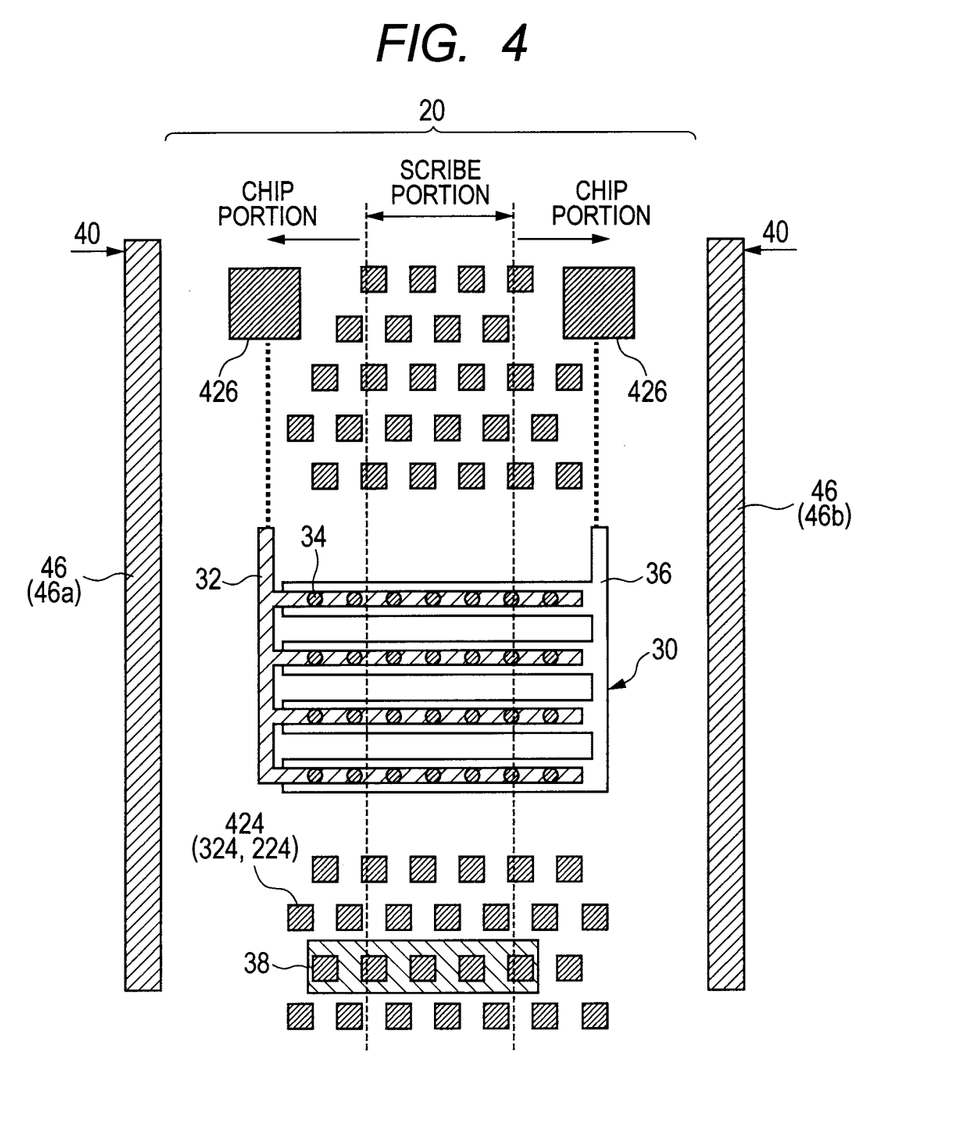
FIG. 4 is a top view illustrating a configuration of a semiconductor device according to a second embodiment.

FIG. 4 is a top view illustrating a configuration of a semiconductor device according to a second embodiment, which corresponds to FIG. 2 of the first embodiment. The semiconductor device according to this embodiment is identical in the configuration with the semiconductor device according to the first embodiment except for the provision of a second TEG pattern 38.

The second TEG pattern 38 is, for example, a TEG pattern for confirming the wiring capacity or the leakage characteristic, or a TEG pattern for confirming the via hole resistance, and has a pattern different from that of the first TEG pattern 30. Since the second TEG pattern 38 does not need to be visible from above of the passivation film 500, the second TEG pattern 38 is arrayed at a position overlapping with the dummy patterns 224, 324, and 424 in the planar view.

Similarly, in this embodiment, the same advantages as those in the first embodiment can be obtained. If an area where the dummy patterns 224, 324, and 424 are not provided is widened, there is a possibility that an in-plane variation occurs in the respective wirings. On the contrary, in this embodiment, because the dummy patterns 224, 324, and 424 are disposed over the second TEG pattern 38, the possibility that the in-planar variation occurs in the respective wirings can be suppressed.

Figure 5:
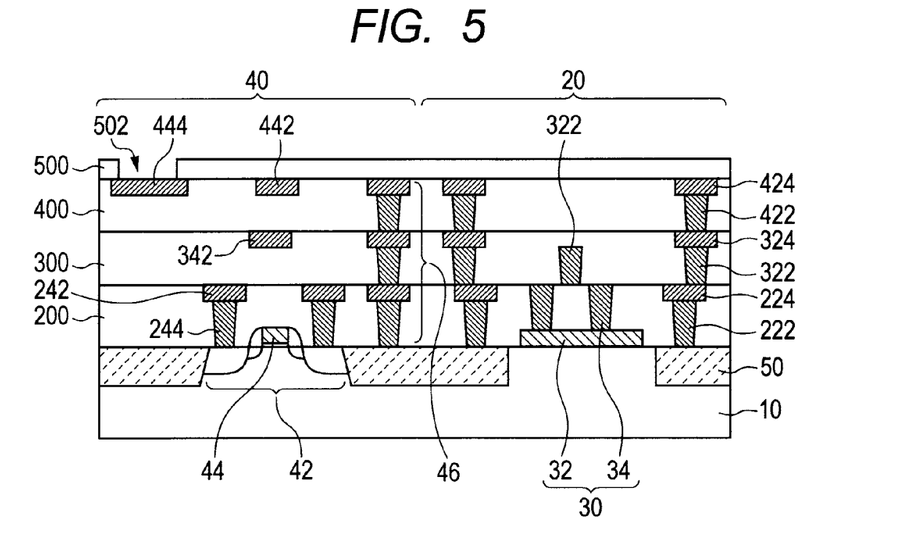
FIG. 5 is a cross-sectional view illustrating a configuration of a semiconductor device according to a third embodiment.

FIG. 5 is a cross-sectional view illustrating a configuration of a semiconductor device according to a third embodiment, which corresponds to FIG. 1 of the first embodiment. The semiconductor device according to this embodiment is identical in the configuration with the semiconductor device according to the first embodiment except that at least one dummy via hole 322 is provided in an area overlapping with the first TEG pattern 30 in the planar view.

The array density of the dummy via hole 322 is smaller than the array density of the dummy patterns 224, 324, and 424 which are dummies of the wiring layers. Accordingly, if a test using the first TEG pattern 30 is required, even if the layers over the first TEG pattern 30, such as the passivation film 500 and the wiring layers 300, 400 are not removed, the first TEG pattern 30 is visible, or the first TEG pattern 30 can be irradiated with a laser beam.

Figure 6:
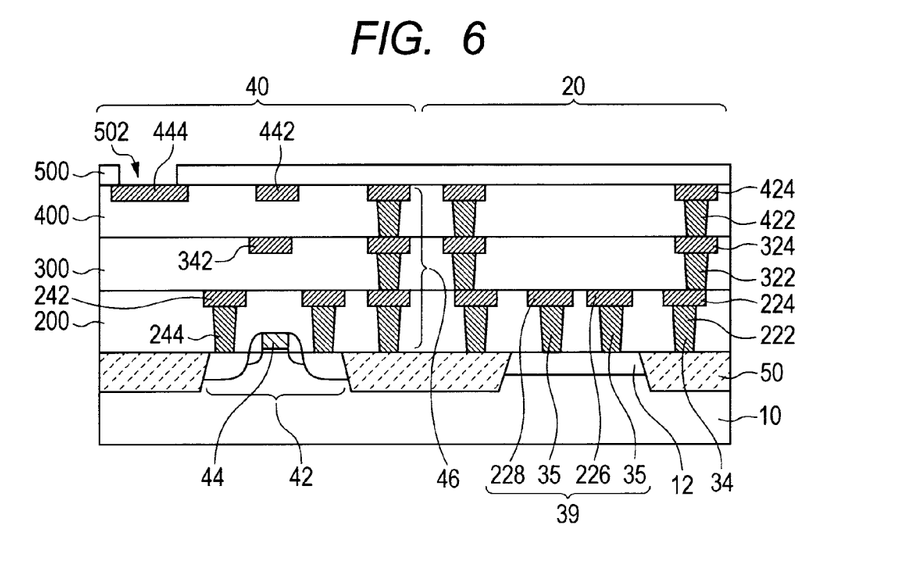
FIG. 6 is a cross-sectional view illustrating a configuration of a semiconductor device according to a fourth embodiment.
Figure 7:
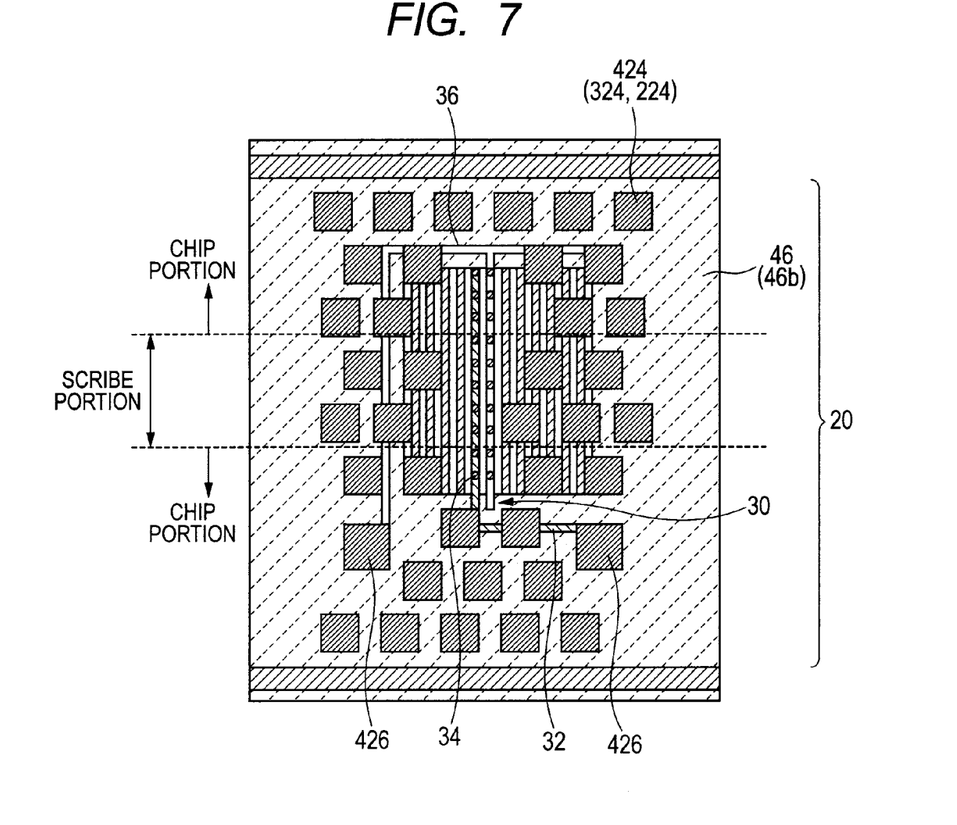
FIG. 7 is a top view illustrating a scribe area and a periphery thereof in the semiconductor device illustrated in FIG. 6.

FIG. 6 is a cross-sectional view illustrating a configuration of a semiconductor device according to a fourth embodiment, which corresponds to FIG. 1 of the first embodiment. FIG. 7 is a diagram illustrating an example of a planar layout of the semiconductor device illustrated in FIG. 6, which corresponds to FIG. 2 of the first embodiment. The semiconductor device according to this embodiment is identical in the configuration with the semiconductor device according to the first embodiment except that the first TEG pattern 30 is replaced with a first TEG pattern 39. The first TEG pattern 39 has, for example, a first pattern 226, a second pattern 228, and a contact 35. The first pattern 226 and the second pattern 228 are formed in the same layer as that of the wiring 242 and the dummy pattern 224, that is, in a layer over the transistor 42. The first pattern 226 and the second pattern 228 extend in the same direction. Another conductive pattern is not formed between the first pattern 226 and the second pattern 228. The first TEG pattern 39 eliminates overlap with all of the dummy patterns 424 and 324 in the planar view. The element isolation film 50 is not formed below an area where the first pattern 226 and the second pattern 228 are formed. Instead, a diffusion layer 12 is formed. The first pattern 226 and the second pattern 228 are coupled to the diffusion layer 12 through the contact 35.

Although not illustrated in FIG. 6, multiple other TEG patterns 229 (refer to FIG. 7) is formed in the scribe area 20 in the same area as that of the first pattern 226. Those TEG patterns 229 extend in parallel to the first pattern 226 and the second pattern 228. An interval of the TEG patterns 229, an interval between the first pattern 226 and the second pattern 228, an interval between the first pattern 226 and the TEG pattern 229 adjacent to the TEG pattern 229, and an interval between the second pattern 228 and the TEG pattern 229 adjacent to the second pattern 228 are equal to each other. Also, the TEG patterns 229 overlap with the dummy patterns 424 and 324 in the planar view.

Figure 8:
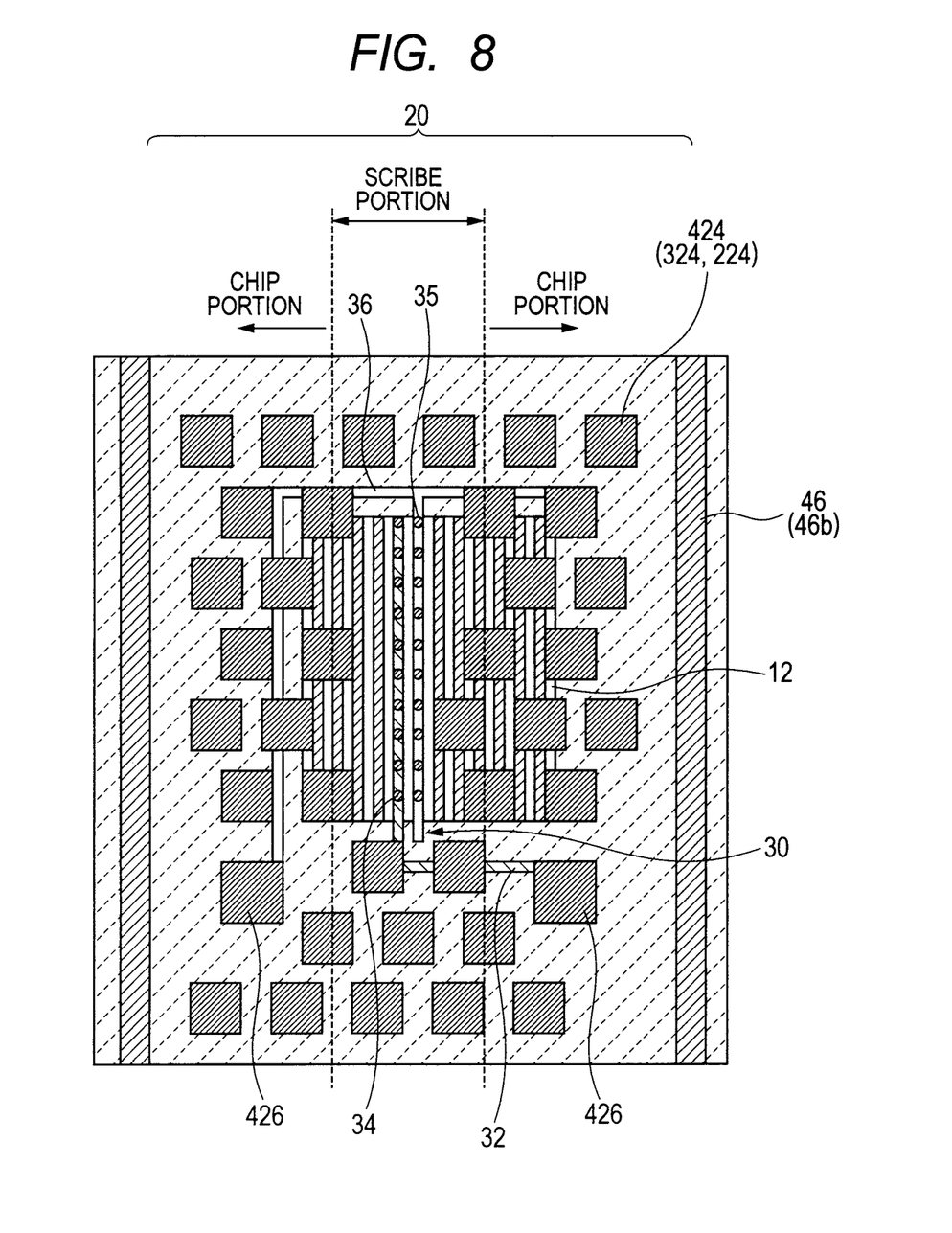
FIG. 8 is a top view illustrating a modified example of FIG. 7.

The layout of the first TEG pattern 39 with respect to the scribed portion may be conducted as illustrated in FIG. 8.

Similarly, in this embodiment, the same advantages as those in the first embodiment can be obtained.

The embodiments of the present invention have been described above. Those embodiments exemplify the present invention, and various configurations other than the above can be applied. For example, the layer in which the first TEG pattern is formed is not limited to the above-mentioned layer.

What is claimed is:

1. A semiconductor device comprising:
    a first TEG (test element group) pattern;
    a plurality of wiring layers formed over the first TEG pattern;
    a wiring and a plurality of dummy patterns formed over each of the wiring layers; and
    an electrode pad formed in an uppermost wiring layer,
    wherein the first TEG pattern eliminates overlap with all of the wirings and the dummy patterns in a planar view.

2. The semiconductor device according to claim 1, further comprising: a plurality of dummy connection members that is formed between the first wiring layer and the second wiring layer located over the first wiring layer,
    wherein at least one of the dummy connection members overlaps with the first TEG pattern.

3. The semiconductor device according to claim 1, further comprising: a second TEG pattern that is formed in the first layer and has a pattern different from the first TEG pattern,
    wherein the second TEG pattern overlaps with any one of the dummy patterns in the planar view.

4. The semiconductor device according to claim 1,
    wherein the first TEG pattern is a TEG pattern for optical beam induced resistance change (OBIRCH).

5. The semiconductor device according to claim 4, further comprising: a test electrode formed in the uppermost wiring layer, and coupled to the first TEG pattern through the patterns and the via holes formed in the wiring layers.

6. The semiconductor device according to claim 1, further comprising:
    a substrate; and
    a transistor that is formed in the substrate and has a gate electrode,
    wherein the gate electrode is formed in the first layer.

7. The semiconductor device according to claim 1, further comprising:
a substrate; and
a transistor that is formed over the substrate,
wherein the first layer is located over the transistor.

8. A semiconductor device comprising:
a first TEG (test element group) pattern;
a plurality of wiring layers formed over the first TEG pattern;
a wiring and a plurality of dummy patterns formed over each of the wiring layers; and
an electrode pad formed in an uppermost wiring layer,
wherein the first TEG pattern eliminates overlap with all of the wirings and the dummy patterns in a planar view,
wherein the dummy patterns are disposed at positions sandwiching the first TEG pattern in the planar view.

9. A semiconductor device comprising:
a first TEG (test element group) pattern;
a plurality of wiring layers formed over the first TEG pattern;
a wiring and a plurality of dummy patterns formed over each of the wiring layers; and
an electrode pad formed in an uppermost wiring layer,
wherein the first TEG pattern eliminates overlap with all of the wirings and the dummy patterns in a planar view,
wherein the first TEG pattern is a TEG pattern for confirming a positional displacement in the planar view.

* * * * *